US005516030A

United States Patent [19]
Denton

[11] Patent Number: 5,516,030
[45] Date of Patent: May 14, 1996

[54] METHOD AND APPARATUS FOR ASSEMBLING BALL GRID ARRAY COMPONENTS ON PRINTED CIRCUIT BOARDS BY REFLOWING BEFORE PLACEMENT

[75] Inventor: Ronald D. Denton, Spring, Tex.

[73] Assignee: Compaq Computer Corporation, Houston, Tex.

[21] Appl. No.: 277,592

[22] Filed: Jul. 20, 1994

[51] Int. Cl.$^6$ .............................. B23K 1/012; B23K 37/04
[52] U.S. Cl. ..................... 228/180.22; 228/212; 228/49.5
[58] Field of Search ............................... 228/180.22, 212, 228/44.7, 49.5, 20.1

[56] References Cited

U.S. PATENT DOCUMENTS

| 4,805,827 | 2/1989 | Coffman et al. | 228/20.1 |
|---|---|---|---|
| 4,828,162 | 5/1989 | Donner et al. | 228/49.5 |
| 5,222,649 | 6/1993 | Funari et al. | 228/20.1 |

OTHER PUBLICATIONS

Cascio et al., "Hot Gas Gun," *IBM Tech. Discl. Bull.*, vol. 15, No. 3, Aug. 1972, pp. 822–823.
"Robotic Hot Air . . . Device," *IBM Tech. Discl. Bull.*, vol. 30, No. 1, Jun. 1987, pp. 114–116.

"BGA Process Bulletin #22.200," Air–Vac Engineering Co., Inc., Nov. 8, 1993.

*Primary Examiner*—P. Austin Bradley
*Assistant Examiner*—Jeffrey T. Knapp
*Attorney, Agent, or Firm*—L. Jon Lindsay

[57] ABSTRACT

A method and apparatus are available for manufacturing a printed circuit board assembly by reworking a ball grid array component on a populated circuit board. The component is first aligned over the landing area on the board. Then hot gas is injected between the component and the board. This gas is hot enough to reflow the solder balls on the component. Then the component is connected to the landing area of the board. The component is held away from the board during the reflow step and is dropped onto the landing area after the solder balls reflow. A special nozzle and nozzle insert are used to hold the component away from the PCB by means of a vacuum suction.

13 Claims, 6 Drawing Sheets

METHOD AND APPARATUS FOR ASSEMBLING BALL GRID ARRAY COMPONENTS ON PRINTED CIRCUIT BOARDS BY REFLOWING BEFORE PLACEMENT

FIELD OF THE INVENTION

This invention relates to the manufacturing of printed circuit boards that incorporate ball grid array components, and is particularly concerned with techniques for reworking ball grid array components on fully assembled printed circuit boards by reflowing the solder balls using hot gas while isolating the component from the rest of the assembly.

BACKGROUND OF THE INVENTION

The past decade has witnessed an explosion in demand for increasingly powerful electronic products with smaller and smaller packages. In response, manufacturers have incorporated high density component assemblies into their products; but limits were soon reached as to improvements in product cost, packaging density, circuit performance, and reliability in using conventional through-hole packaged component assembly technology. Therefore, manufacturers invoked a trend towards the use of surface mount devices in their designs in the mid-1980's.

Surface mountable devices do not require component mounting or lead holes for board affixation, and their packaging size is relatively smaller than that of their pin-through cousins. With this technology, manufacturers are able to reduce overall circuit board assembly size through increased placement densities, finer pitch component terminals, and dual-sided component mounting. Further, the use of smaller mass surface mount technology (SMT) components increases vibration and shock resistance. Also, smaller component sizes and increased placement density mean shorter distances for signals to travel, thereby improving high speed, high frequency circuit performance.

More recently, component manufacturers have introduced a type of surface-mountable component chip package, known as ball grid array or BGA, which discards the use of external leads in integrated circuit chip packaging altogether. Connections between the BGA device and the circuit board are made through contact pads placed on the underside of the chip. Visually, the arrangement of contact pads appears as a two-dimensional grid or matrix of small solder blobs or balls extending from the underside of the chip, hence the name Ball Grid Array. A complementary contact pad array or landing area is located on a surface of the circuit board where the BGA device is to be positioned. Since no leads extend from the BGA package, its effective footprint is appreciably smaller than that of comparable dual or quad flat package SMT designs.

Since typically the BGA footprint is so compact and its lead count and density are so high, it is necessary in manufacturing to place the BGA on the landing area of the circuit board with the solder balls aligned with their corresponding contact pad. Then the entire BGA is heated by blowing hot gas onto the top of the BGA. The heat is transferred in a conductive heating process through the BGA to the solder balls until the solder balls reflow. When reflow occurs, the BGA visibly lowers closer to the circuit board due to the melted solder balls.

Because of the need to transfer the heat through the BGA in order to reflow the solder balls, there is a loss of heating efficiency in this technique. The BGA acts as a heat sink so that the solder balls are only indirectly heated by the hot gas. It would be more desirable to heat the solder balls directly by the hot gas.

Another method of placing the BGA component on the circuit board involves the use of a pivot arm which holds the component above and away from the board. The pivot arm holds the component at an angle to the circuit board up in the air high enough for a nozzle to be positioned to blow hot gas at the bottom of the component. This nozzle is separate from the pivot arm. Thus, the nozzle is not the part that holds the component. The nozzle points at the solder balls and blows a stream of hot gas directly onto them until the solder balls reflow. Thus, the stream of hot gas is not guided by an airflow passageway between the nozzle and the component. Then the nozzle quickly moves out of the way, and the pivot arm quickly pivots down and places the component on the board. The arm then releases the component and pivots back up out of the way. This method requires additional machinery to accomplish the same task as the conductive heating process, and the nozzle retraction, pivot down and place operations must take place quickly to allow the solder balls to remain molten, further complicating the machinery. Thus, this method increases the complexity of the process, but has the advantage of only heating the solder balls, leaving the BGA and the circuit board much cooler.

Another method of placing a BGA component on a circuit board is to set the component directly onto the landing area of the circuit board and to use a special nozzle for blowing hot air under the component. This method, however, provides non-uniform heating of the solder balls and does not permit easy airflow due to the very small space between the component and the board.

Therefore, it is necessary to provide a method and apparatus for assembling or reworking printed circuit boards that directly heats the solder balls of a BGA component with a minimum of complexity in the apparatus.

SUMMARY OF THE INVENTION

The method of assembling or reworking printed circuit boards (PCBs) according to the invention involves reflowing the solder balls of the BGA component before the component contacts the circuit board. This technique permits the solder balls to be heated directly by a stream of hot gas. The BGA is held generally parallel to and spaced above the circuit board and the stream of hot gas is injected between the board and the BGA in an airflow passageway until the solder balls reflow. Then the hot gas airflow is turned off and the BGA is quickly lowered or dropped onto the landing area of the PCB.

In this method, it is advantageous to carefully align the solder balls of the component with the solder pads of the PCB prior to reflowing the balls because the step of placing the component on the PCB to contact the balls with the pads must be done quickly, leaving no time to perform the alignment after reflow. Additionally, in order to quickly place the component onto the PCB and to maintain proper alignment with the PCB, it is preferable to hold the component as close to the PCB as possible while still providing a space between the component and the PCB to permit sufficient airflow. It is necessary to hold the component away from the PCB in order to maximize gas flow, so the solder balls can heat up quickly without unnecessary heating of parts of the PCB. Thus, the advantages and disadvantages must be carefully balanced in order to find the most desirable distance for holding the component relative to the PCB during the reworking cycle.

Further, it is advantageous to apply the stream of hot gas to the underside of the component for as short a duration as possible to prevent unnecessary heating of the component or the PCB. It is important, however, to define a reworking cycle with a minimum time for applying the stream of hot gas. This minimum time for applying the stream of hot gas is necessary so that repeatable results may be obtained by the cycle.

The method will preferably use a special nozzle which is capable of both holding the component over the PCB and injecting hot gas between the component and the PCB.

The parts of the reworking cycle are preheat, reflow and cooling. Careful process control according to the invention involves regulation of certain critical parameters during the parts of the cycle. The critical parameters are the internal temperatures of the nozzle, the airflow within the nozzle and the duration of each part of the cycle.

BRIEF DESCRIPTION OF THE DRAWINGS

A better understanding of the present invention may be obtained when the detailed description of the preferred embodiments is considered in conjunction with the following drawings, in which.

DETAILED DESCRIPTION OF THE PREFERRED EMBODIMENT

Figure 1:
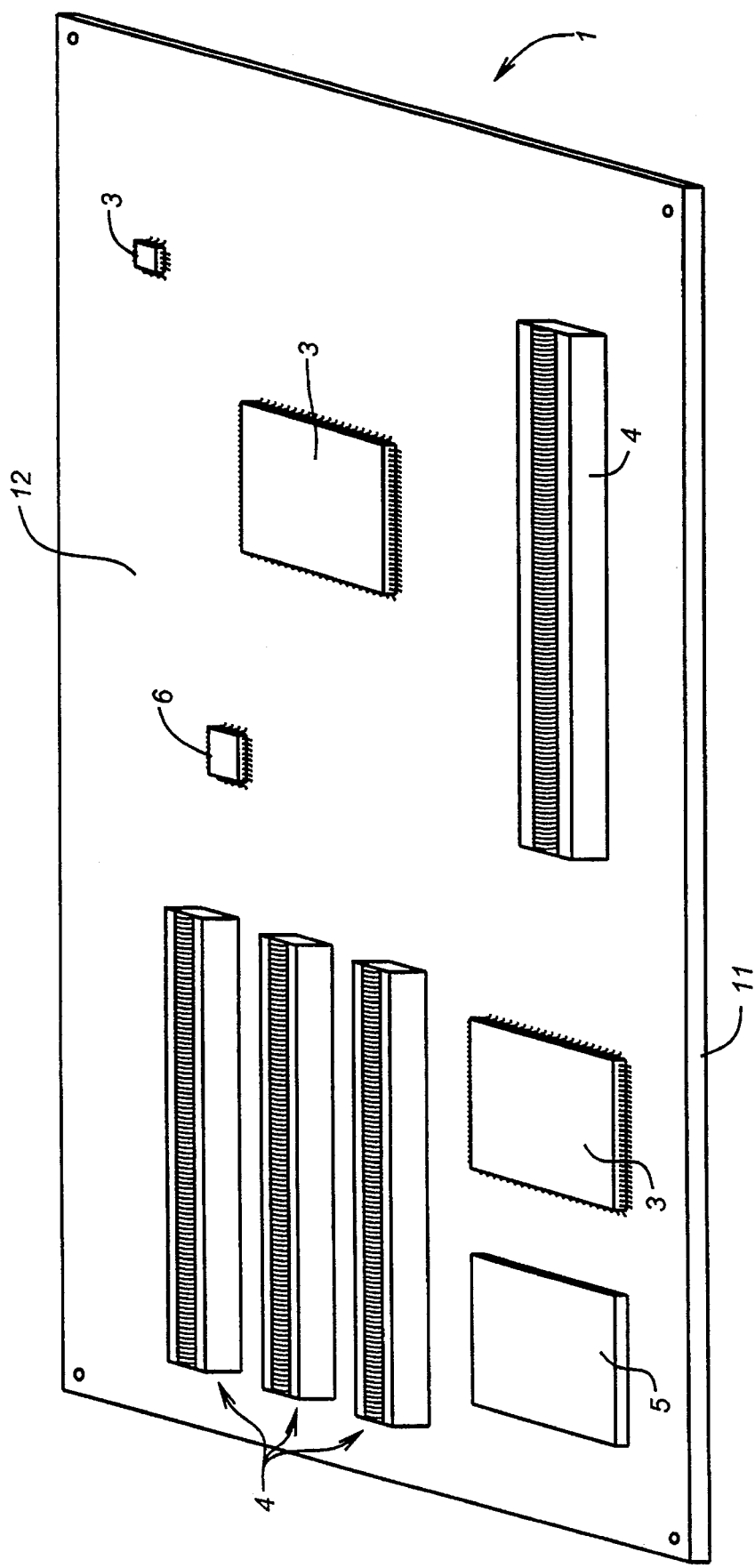
FIG. 1 is a top perspective view of a simplified circuit board assembly showing a BGA-mounted component which can be used in the present invention.

Referring now to FIG. 1, a top perspective view of a simplified circuit board assembly, including printed circuit board (PCB) 1, is shown on which the present invention may be practiced. The PCB includes at least two surfaces, a top layer 12 and a bottom layer 13 (FIG. 2), both preferably suitable for mounting a plurality of electrical components separated by one or more internal layers. Each of the layers are preferably made of copper on epoxy glass such as FR-4, polyamide glass/copper, cyanate ester glass/copper, Aramid/copper, PTFE/copper and ceramic/copper, may be used as known to those skilled in the art of fabricating multilayer PCBs. PCB 1 is preferably rectangular in shape including an edge 11, although the present invention is not limited to any particular geometric shape of PCBs.

Figure 2:
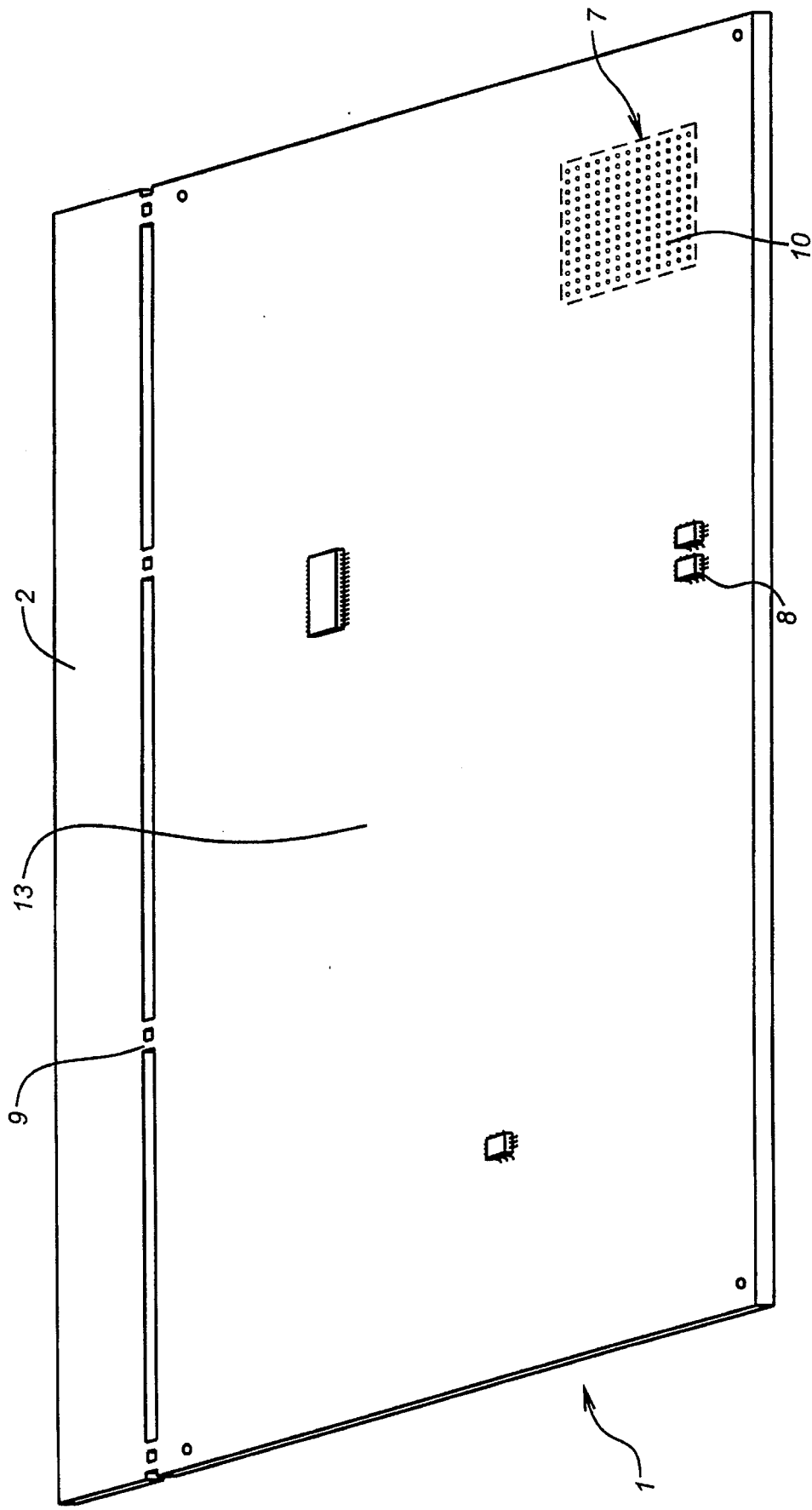
FIG. 2 is a bottom perspective view of the circuit board assembly shown in FIG. 1.
Figure 3:
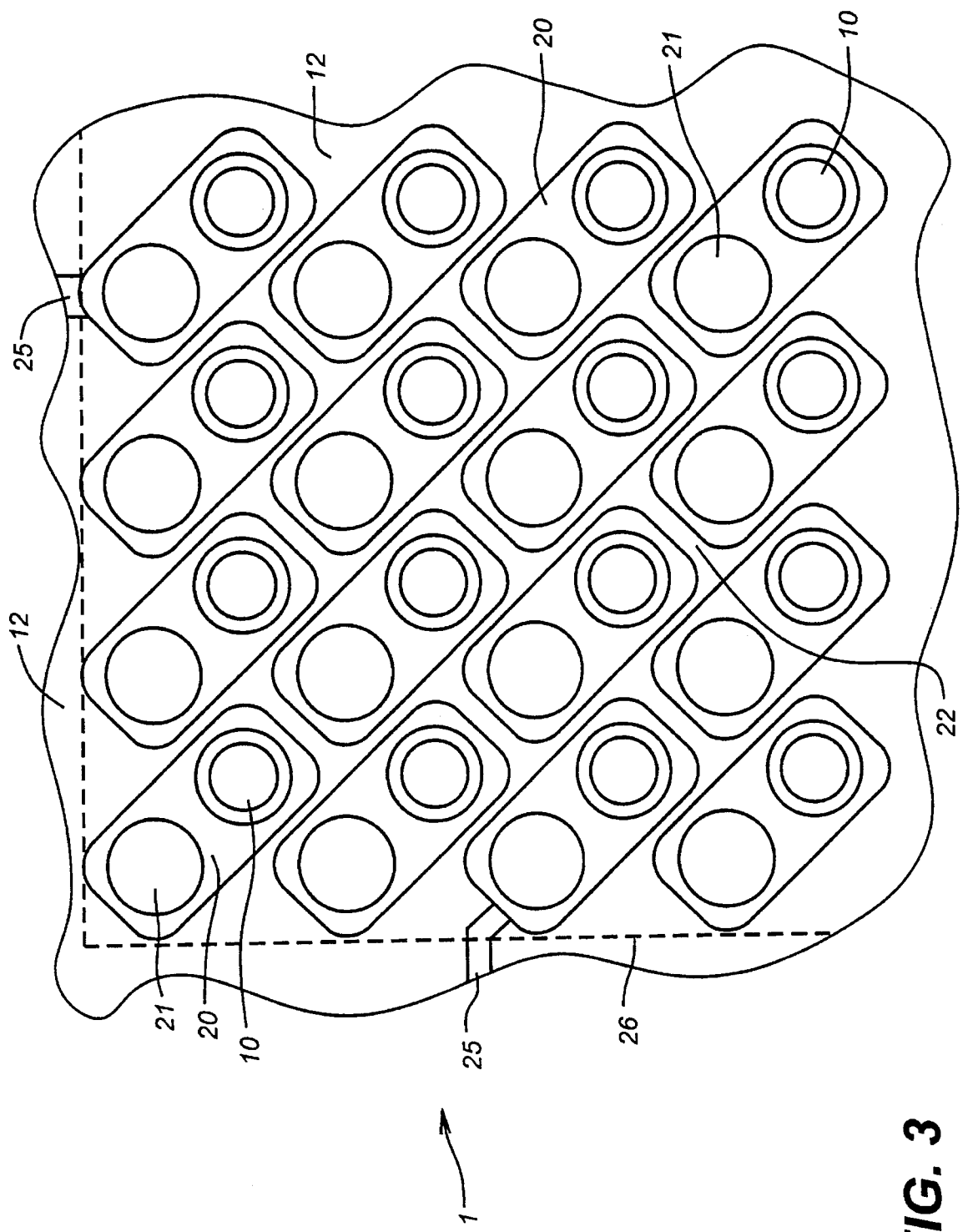
FIG. 3 is an expanded top view of a portion of a BGA landing area, prior to component affixation.

A ball grid array (BGA) packaged integrated circuit 5 is shown mounted on PCB 1 at the BGA landing area 22 (FIG. 3). A single, rectangularly-shaped BGA component 5 is shown, but it will be understood to those persons skilled in the PCB manufacturing art that the present invention may be practiced for any shape or size of BGA component or any number of mounted BGA components. The BGA component is attached to the board surface through a plurality of landing area contact pads 21 (FIG. 3) aligned with the solder ball matrix located on the underside of the BGA chip. A plurality of other electrical components, including quad plastic flat packaged integrated circuits 3, surface mount dual inline packaged integrated circuits 6, card edge connector receptacles 4 and various discrete components 8(FIG. 2) are shown mounted on the top and bottom layers of PCB 1 for the purpose of illustration.

Through vias 10 (FIG. 2) establish electrical connections between circuit patterns residing within the different board layers. These vias are typically formed by drilling holes through all layers of PCB 1 and coating their edges with a conductive material. The conductive material used is preferably solder, although other conductors may be used as generally known by those skilled in the art of PCB manufacturing.

Conductive signal traces 25 (FIG. 3) are routed on the internal and external layers of the PCB 1 to electrically connect the inputs and outputs of the electrical components mounted on the PCB surface layers, thereby forming the aforementioned circuit patterns. Conductive traces 25 are preferably formed of copper, although other conductive materials may be used.

Figure 4:
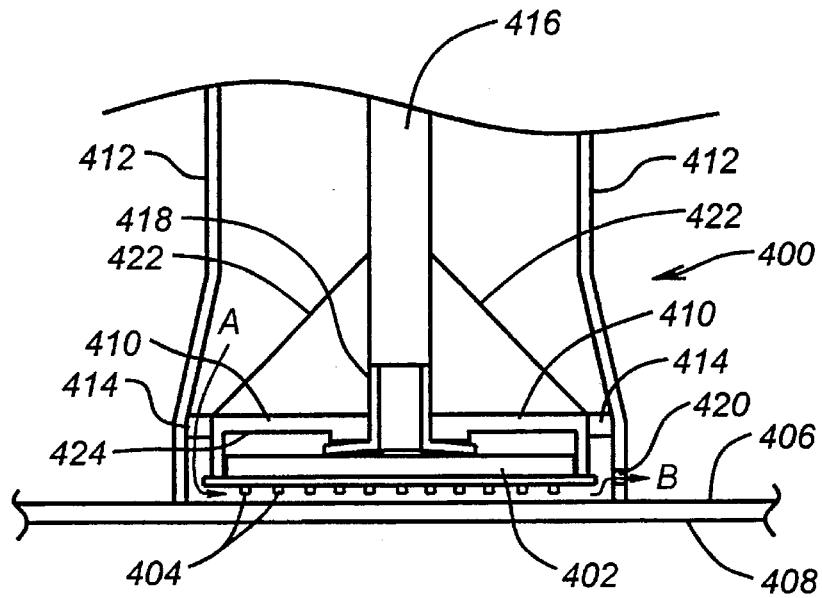
FIG. 4 is a side cross-sectional view of a nozzle, BGA component, and circuit board prior to placement of the component according to the present invention.

FIG. 2 is a bottom perspective view of a simplified diagram of the circuit board assembly shown in FIG. 1. Board region 7 lies directly beneath the BGA device, and the dashed box indicates the BGA landing area periphery 26 (FIG. 4). The plurality of through vias 10 placed within the BGA landing area is also indicated.

FIG. 3 is an expanded diagram of a BGA landing area 22 corner section residing on the top layer 12 immediately beneath BGA component 5 as shown in FIG. 1. This view illustrates the section appearance prior to chip affixation. The BGA landing area 22 is comprised of tinned contact pads 21, through vias 10, conductive pad to via connecting plates 20 and conductive circuit traces 25. The conductive connecting plates 20 are preferably made from the same material as the conductive circuit traces 25, though any conductive material known to those skilled in the PCB manufacturing art may be substituted. The periphery 26 of the BGA landing area 22 is defined by dashed lines.

As the name suggests, the contact pads 21 will be used to form the connection between the PCB circuit patterns and the solder ball grid of a BGA component. In this embodiment, the contact pads are circular, but the actual shape is not of relevance.

Through vias 10 are plated through holes with a constant diameter throughout the layers of PCB 1, used as an electrical through connection between circuit patterns found on the surface and in the internal board layers. Normally, no component leads or reinforcing material are placed within these vias. The diameter of the vias 10 is preferably within a range of 12 to 18 mils.

FIG. 3 also shows the relationship between the contact pads 21 and the through vias 10. Due to the high pin density and high pin count of BGA devices commonly encountered in the electronics manufacturing arts, the contact pad spacing within the BGA landing area will normally not permit conductive circuit traces 25 from being placed in between the connecting plates 20. Therefore, except for a few pads located at the periphery of the BGA landing area, the contact pads 21 are connected only to vias 10. The vias 10 distribute BGA component pin connections across the other board layer or layers to allow full electrical access within the minimum surface area. Conductive circuit traces 25 are shown only being routed to those contact pads 21 or connecting plates 20 located on the landing area periphery.

Figure 5:
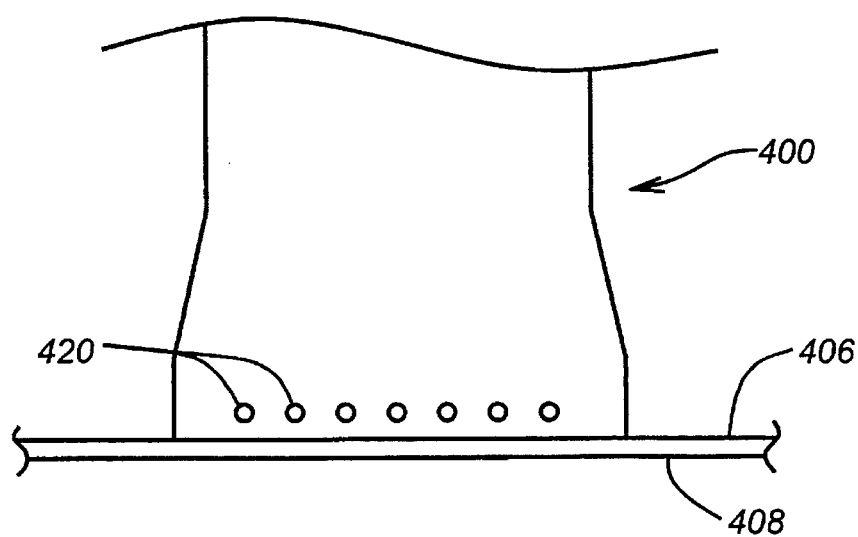
FIG. 5 is a side view of the nozzle of FIG. 4 showing air vents in the side.

FIG. 4 shows a side cross-sectional view of a nozzle 400 used with the present invention. This nozzle 400 is substantially rectangular from a bottom view (not shown), but any shape necessary for the BGA component to be used is appropriate. Nozzle 400 has nozzle walls 412. Spacers 414 hold nozzle insert 410 within nozzle walls 412. A vacuum tube 416 connects to nozzle insert 41 0. A flexible vacuum cup 418 is inserted within the vacuum tube 416. The nozzle 400 is pressed down against the top surface 406 of PCB 408. Air vents 420 extend through one of the nozzle walls 412. FIG. 5 shows these air vents 420 in a side view of nozzle 400. A cone-shaped metal heat shield 422 wraps around vacuum tube 416 to cover nozzle insert 410. Nozzle 410 has a recessed surface 424 providing space between nozzle insert 410 and BGA component 402.

A BGA component 402 is shown in its pre-placement position. The BGA component 402 has an array of solder balls 404 arranged on its underside. In this pre-placement position, the BGA component 402 is held above the top surface 406 of PCB 408 and is generally parallel to the PCB 408. A gap is clearly seen in this position between the solder balls 404 and the PCB top surface 406. The BGA component 402 is held in this position by nozzle insert 410. A landing area, according to landing area 22 shown in FIG. 3, with landing pads corresponding to the solder balls 404 is formed on the top surface 406 of PCB 408.

Figure 6:
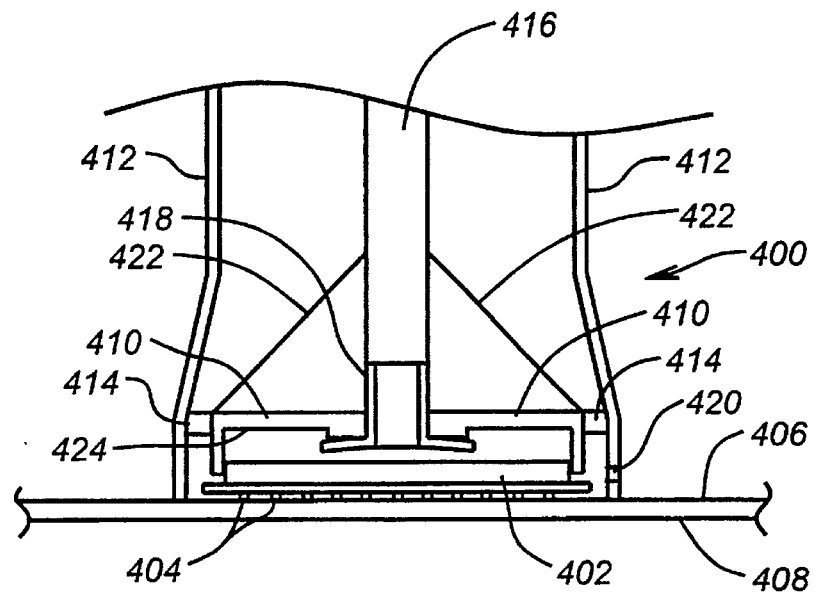
FIG. 6 is a side cross-sectional view of a nozzle, BGA component, and circuit board after placement of the component according to the present invention.

FIG. 6 shows the same nozzle 400, BGA component 402, and PCB 408 as in FIG. 4, but with the BGA component 402 in its post-placement position. In this position, there is no gap between the solder balls 404 and the top surface 406 of PCB 408, but there is a gap between the BGA component 402 and nozzle insert 410. Additionally, in this position, solder balls 404 electrically connect BGA component 402 to the landing pads of the landing area on the top surface 406 of PCB 408.

In the pre-placement position of FIG. 4, a vacuum created in vacuum tube 416 causes vacuum cup 418 to hold BGA component 402 up against the nozzle insert 410. The combination of the nozzle insert 410 and the suction action of the vacuum holds BGA component 402 in the pre-placement position. This suction is maintained with nozzle 400 suspended above PCB 408, so that BGA component 402 can be very carefully aligned with the landing pads 21 of landing area 22 before nozzle 400 is placed in contact with PCB 408. While nozzle 400 is held above PCB 408, the BGA component 402 is carefully aligned with the landing area 22 such that solder balls 404 align with corresponding landing pads 21. After careful alignment of the BGA component 402 with the landing pads 21, nozzle 400 is set down onto PCB 408 such that there are substantially no air gaps between nozzle walls 412 and PCB 408.

After nozzle 400 is placed in contact with PCB 408, an airflow is started through nozzle 400. The internal surface of nozzle walls 412, the external surface of vacuum tube 416, and the top surface of cone-shaped metal heat shield 422 form an airflow passage. This airflow is channeled by the airflow passage in substantially the direction of arrow A. The airflow passes between spacers 414 and underneath BGA component 402. After passage under BGA component 402, the airflow exits nozzle 400 through vents 420 in substantially the direction of arrow B. In this manner, the airflow is forced to pass between BGA component 402 and PCB 408.

The gas in the airflow is heated sufficiently to cause solder balls 404 to reflow, or melt. This part of the process is the reflowing part, and is preferably done for approximately two minutes with a nozzle internal temperature sufficient to bring the solder balls 404 above reflow temperature for approximately one minute. This reflow temperature is approximately 183 degrees C. After solder balls 404 reflow, the airflow and the vacuum are stopped, and BGA component 402 drops down onto the landing area 22 into the post-placement position of FIG. 6. After solder balls 404 cool, they solidify again and form an electrical contact with landing pads 21. Nozzle 400 can then be removed leaving BGA component 402 in place. By this method, solder balls 404 are heated directly by blowing hot gas onto them while minimizing the heating of BGA component 404 and PCB 408.

Cone-shaped metal heat shield 422 deflects the hot gas away from nozzle insert 410. This feature helps to prevent unwanted topside heating of BGA component 402 by keeping the heat away from nozzle insert 410. Further unwanted topside heating of BGA component 402 is prevented by the fact that recessed surface 424 provides a large gap between nozzle insert 410 and BGA component 402. Additionally, unwanted topside heating of BGA component 402 is further prevented by the fact that nozzle insert 410 is preferably made of a poor heat-conducting material, such as fiberglass.

This method can be performed using Air-Vac Engineering Co., Inc's DRS-22 rework station. Any similar machine would be adequate; however, several features are required: 1) first the nozzle must have a small mass so that it will not become a large heat sink, 2) the nozzle should be small so that nearby parts on the PCB will not obstruct its use, 3) the nozzle must have a vacuum fitting that will allow the part to be held up away from the PCB during heating, 4) the machine must have a method for accurate alignment, and 5) the machine must be able to deliver very low gas flows.

The preferred gas used in the airflow is dry nitrogen.

Top and bottom side PCB preheating may be added as necessary to control board warp.

Figure 7:
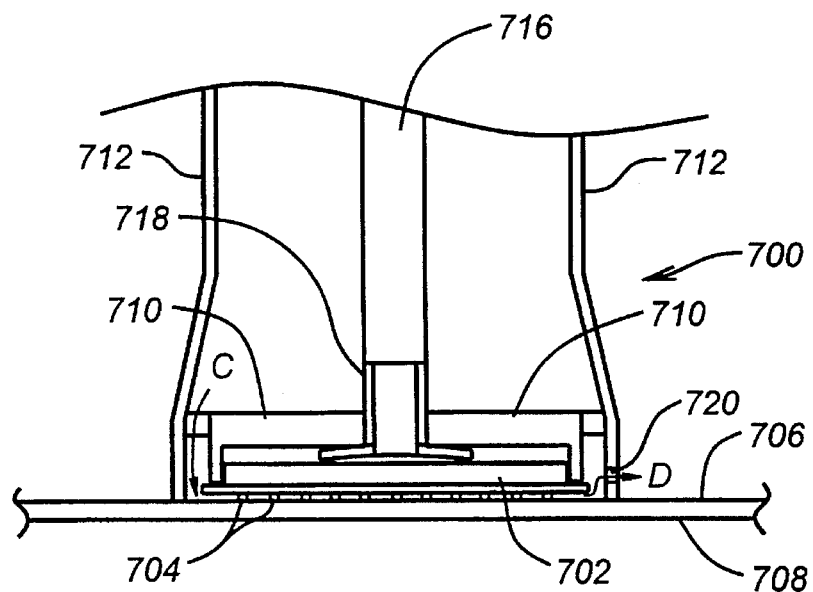
FIG. 7 is a side cross-sectional view of a first prior art nozzle, BGA component and circuit board.

A comparison with the prior art will now be shown. FIG. 7 shows a prior art nozzle configuration. Nozzle 700 holds BGA component 702 such that solder balls 704 are in contact with top surface 706 of PCB 708 at all times. In this configuration, hot air is blown under BGA component 702 in the direction of arrow C and exits nozzle 700 through vents 720 in side walls 71 2 in the direction of arrow D. This configuration uses nozzle insert 71 0 to hold BGA component 702 inside nozzle 700. A vacuum inside vacuum tube 716 and flexible vacuum cup 718 holds BGA component 702 in nozzle insert 710. With this approach to heating solder balls, however, there will always be some undesired heating of the BGA component 702 and PCB 708 by conduction. Airflow around solder balls 704 is very poor in this configuration, and heating is not uniform.

Figure 8:
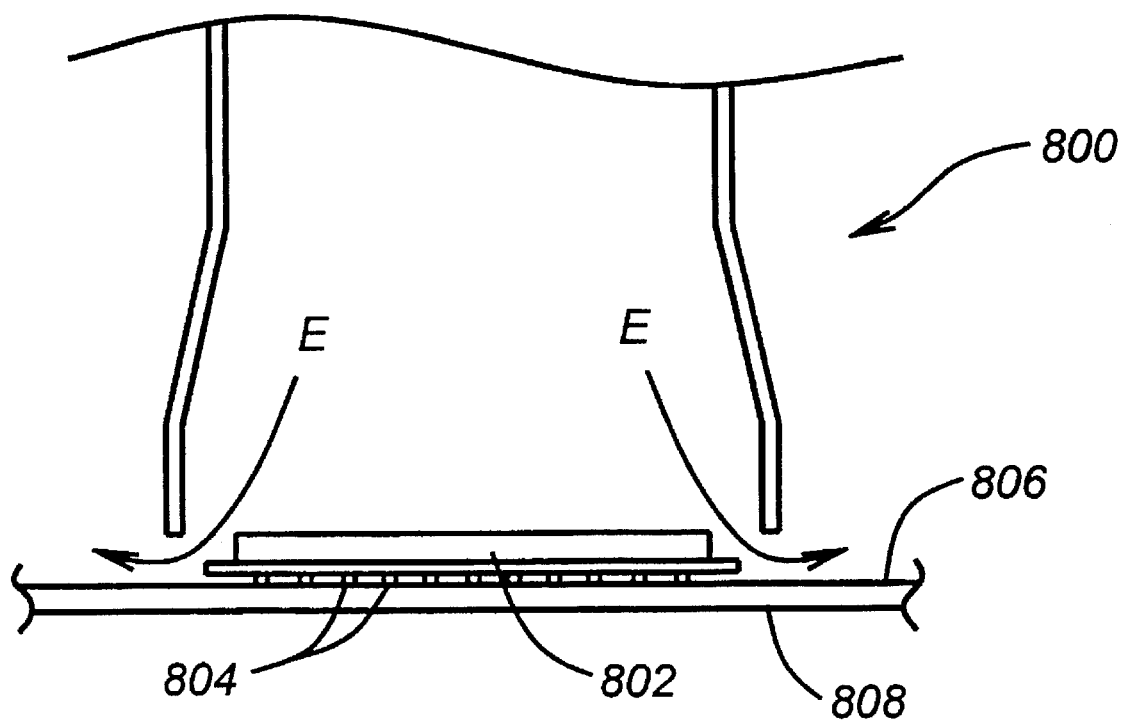
FIG. 8 is a side cross-sectional view of a second prior art nozzle, BGA component and circuit board.

FIG. 8 shows another prior art method of reworking BGA components. In this method, BGA component 802 is placed with solder balls 804 on the top surface 806 of PCB 808. Nozzle 800 is held over BGA component 802 and hot air is blown down onto the top of BGA component 802 according to airflow arrows E. Heat is transferred through BGA component 802 by conduction to heat and reflow solder balls

804. This method has the undesirable requirement that BGA component 802 be heated more than solder balls 804.

An advantage of the current invention over the prior art is in the fact that the BGA component is allowed to drop a short distance onto the landing pads. This drop provides a slight placement pressure, which helps to break the surface tension of some of the solder balls. Thus, solderability is enhanced with this method.

The current invention provides more efficient heating of the solder surfaces than the prior art methods. In the preferred embodiment, this is accomplished by providing very low gas flow for the airflow. Gas flow as high as 45% of 6 scfm will blow solder balls off the BGA component in the preferred configuration, so gas flows as low as 30% of 6 scfm are used. The hot gas blown through the nozzle is preferably nitrogen. Holding the BGA component above the PCB during reflow improves the gas flow under the component, and thereby further improves heating. Uniform heating of the underside of the PCB may help to prevent localized board warp. If underside board heating can be avoided, however, it is preferable to do without it. Since this method reflows the solder balls before placement, accurate alignment of the component must be made before reflow.

For small PCBs or landing areas near the edge of PCBs, the underside heating can be done sufficiently with a nozzle blowing hot air at 45% of 6 scfm to heat an area slightly larger than the topside landing area to approximately 100 degrees C. However, landing areas near the center of large PCBs require heating the entire underside of the PCB to 100 to 120 degrees C. The preferred heating element in this case is a silicone rubber heating pad similar to those supplied by Omega Inc., part number 6103-K-0/500, controlled with temperature controller SRFG-1218/5. This uniform heating of the PCB effectively eliminates board warp making BGA repair 100% repeatable at any location on large or small PCBs.

Slow heating using the low airflow prevents BGA component delamination, or "popcorning."

To insure repeatability, a short pre-heating cycle before the reflow and placement process and a cooling cycle after the placement process are used. These cycles insure that the process begins at the same temperature each time. The preheat cycle preferably brings the PCB and BGA component to approximately 150 degrees C before the reflow process is begun. The cooling cycle preferably cools the parts to approximately 130 degrees C, or below the reflow temperature. This step is done with the gas flow turned off.

This invention has been described in terms of particular embodiments. Obviously, modifications and alterations will be apparent to those skilled in the art in view of this disclosure, including, but not limited to the configuration of the nozzle and the parameters of the steps of reflowing and placement. It is therefore intended that all such equipments, variations, and modifications fall within the spirit and scope of the invention as claimed.

What is claimed is:

1. A method for manufacturing a circuit assembly comprising the steps of:
   providing a printed circuit board, said printed circuit board comprising a circuit pattern for receiving and connecting a ball grid array packaged component to a first surface of said printed circuit board;
   aligning said ball grid array packaged component over, generally parallel to, and spaced apart from said printed circuit board, said component having an array of solder balls on a bottom side of said component;
   injecting hot gas between said printed circuit board and said ball grid array packaged component, said gas being of a temperature sufficient to reflow said solder balls; and
   contacting said bottom side of said component to said first side of said printed circuit board in order to connect said component and said first side of said printed circuit board after said solder balls reach a molten state.

2. The method of claim 1 wherein said step of aligning includes the step of holding said component in close proximity to the printed circuit board when aligned.

3. The method of claim 1 wherein the step of contacting said component to said printed circuit board includes the step of dropping said component onto said printed circuit board.

4. The method of claim 1 wherein said plurality of circuit patterns includes an array of solder pads corresponding to said array of solder balls, and wherein said step of aligning includes the step of aligning said array of solder balls with said array of solder pads.

5. The method of claim 1 including the further step of inserting said component inside a nozzle prior to said aligning step.

6. The method of claim 5 including the further step of holding said nozzle in close proximity to said printed circuit board prior to said step of injecting hot gas.

7. The method of claim 5 including the further step of holding said nozzle in touching relationship to said printed circuit board prior to said step of injecting hot gas.

8. The method of claim 5 wherein said step of injecting hot gas includes a step of said nozzle injecting said hot gas between said component and said printed circuit board.

9. A method for manufacturing a circuit assembly comprising the steps of:
   providing a printed circuit board, said printed circuit board comprising a plurality of circuit patterns, said circuit patterns including solder pads for receiving and connecting a ball grid array packaged component to a first surface of said printed circuit board, said ball grid array packaged component having an array of solder balls on a bottom side of said component, said solder pads being arranged in an array corresponding to said array of solder balls and being located within a landing area defined by the border of said ball grid array;
   inserting said component into a nozzle, said nozzle having entrance and exit vents for a hot gas;
   aligning said array of solder balls on the bottom side of said component with said array of solder pads;
   moving said nozzle into a touching relationship with said printed circuit board, whereby said nozzle surrounds said landing area, and whereby said nozzle holds said component in a spaced apart and generally parallel relationship to said printed circuit board, said nozzle, said component and said printed circuit board forming an airflow space; injecting said hot gas into said entrance vent, through said airflow space and out of said exit vent;
   said hot gas reflowing said solder balls;
   stopping said injecting of hot gas when said solder balls have reflowed;
   said nozzle releasing said component onto said printed circuit board, whereby said solder balls contact said corresponding solder pads while still molten; and
   allowing said assembly to cool until said solder balls harden, thereby forming an electrical contact with said solder pads.

10. A nozzle, for use with a ball grid array (BGA) packaged component having an array of solder balls on one side thereof, for providing hot gas to reflow the solder for placement of the BGA component on and removal of the BGA component from a PCB comprising:

a nozzle housing having a nozzle wall, an open end, and at least one exit vent in the nozzle wall near said open end;

a nozzle insert displaced within said nozzle housing near said open end, said nozzle insert for receiving the BGA component;

a vacuum tube displaced within said nozzle housing and connected to said nozzle insert for providing a vacuum for holding the BGA component in said nozzle insert; wherein said nozzle housing is capable of being placed on the PCB such that the PCB substantially closes off said open end;

said nozzle insert is capable of holding the BGA component in spaced apart and generally parallel relationship to the PCB, said array of solder balls being spaced apart from and facing said PCB when said nozzle housing is placed on the PCB; and said nozzle housing, said nozzle insert, said at least one exit vent, the BGA component, and the PCB form an airflow passage for permitting hot gas to flow between the BGA component and the PCB in order to reflow the solder.

11. The nozzle of claim 10 wherein the nozzle is capable of dropping the BGA component onto the PCB upon removal of said vacuum.

12. The nozzle of claim 10 further comprising a heat shield disposed within said nozzle for deflecting said hot gas in said airflow passage around said nozzle insert in order to prevent unnecessary heating of said nozzle insert.

13. The nozzle of claim 10 wherein said nozzle insert is made of a poor heat-conducting material.

* * * * *